(12) United States Patent
Takanami

(10) Patent No.: US 9,339,888 B2
(45) Date of Patent: May 17, 2016

(54) BONDING APPARATUS

(71) Applicant: KAIJO CORPORATION, Hamura-shi, Tokyo (JP)

(72) Inventor: Shuichi Takanami, Tokyo (JP)

(73) Assignee: KAIJO CORPORATION, Tokyo (JP)

( * ) Notice: Subject to any disclaimer, the term of this patent is extended or adjusted under 35 U.S.C. 154(b) by 42 days.

(21) Appl. No.: 14/364,059

(22) PCT Filed: Jul. 23, 2013

(86) PCT No.: PCT/JP2013/069909
§ 371 (c)(1),
(2) Date: Jun. 9, 2014

(87) PCT Pub. No.: WO2014/021141
PCT Pub. Date: Feb. 6, 2014

(65) Prior Publication Data
US 2014/0305996 A1 Oct. 16, 2014

(30) Foreign Application Priority Data
Aug. 3, 2012 (JP) ................. 2012-172795

(51) Int. Cl.
*B23K 20/10* (2006.01)
*H01L 23/00* (2006.01)

(52) U.S. Cl.
CPC .............. *B23K 20/106* (2013.01); *H01L 24/78* (2013.01); *H01L 2224/789* (2013.01); *H01L 2224/78301* (2013.01); *H01L 2224/78309* (2013.01); *H01L 2224/78349* (2013.01); *H01L 2924/00014* (2013.01)

(58) Field of Classification Search
CPC ....................................... B23K 20/005–20/007
See application file for complete search history.

(56) References Cited

U.S. PATENT DOCUMENTS

| 4,903,883 | A | * | 2/1990 | Thurlemann | ........ | B23K 20/005 228/1.1 |
| 5,275,324 | A | | 1/1994 | Yamazaki et al. | | |

(Continued)

FOREIGN PATENT DOCUMENTS

| EP | 0725476 A1 * | 8/1996 | .......... H01L 41/0906 |
| JP | 05275502 A | 10/1993 | |

(Continued)

OTHER PUBLICATIONS

International Search Report (ISR) dated Oct. 22, 2013 issued in International Application No. PCT/JP2013/069909.

*Primary Examiner* — Devang R Patel
(74) *Attorney, Agent, or Firm* — Holtz, Holtz & Volek PC

(57) ABSTRACT

A bonding apparatus includes a bonding arm which has a receiving portion facing a center axis of a bonding tool; a pair of capillary holding portions in contact with the bonding tool; a pair of piezoelectric elements configured to generate an ultrasonic vibration in contact with the capillary holding portions; and a pressurizing device which has a pressurizing member arranged to face the receiving portion of the bonding arm and a moving device configured to move the pressurizing member toward the receiving portion of the bonding arm. The pressurizing member is moved in a state in which the pair of piezoelectric elements, the pair of capillary holding portions, and the bonding tool are placed between the receiving portion of the bonding arm to cause the bonding arm to hold the pair of capillary holding portion and the bonding tool.

4 Claims, 6 Drawing Sheets

(56) References Cited

U.S. PATENT DOCUMENTS

| | | | |
|---|---|---|---|
| 5,486,733 A * | 1/1996 | Yamazaki | B06B 3/00 228/1.1 |
| 5,775,567 A * | 7/1998 | Lo | B23K 20/005 228/1.1 |
| 5,890,643 A | 4/1999 | Razon et al. | |
| 6,109,502 A * | 8/2000 | Sato | B23K 20/106 228/1.1 |
| 6,189,761 B1 * | 2/2001 | Kyomasu | B06B 3/00 228/1.1 |
| 6,578,753 B1 * | 6/2003 | Sakakura | B06B 3/00 156/580.1 |
| 7,565,994 B2 * | 7/2009 | Kondo | B23K 20/005 228/1.1 |

FOREIGN PATENT DOCUMENTS

| | | |
|---|---|---|
| JP | 06204302 A | 7/1994 |
| JP | 06295941 A | 10/1994 |
| JP | 2002050649 A | 2/2002 |

\* cited by examiner

BONDING APPARATUS

TECHNICAL FIELD

The present invention relates to a bonding apparatus and, more specifically, to a bonding apparatus configured to allow free setting of vibration frequencies that drive a bonding tool used for bonding wires.

In the related art, a wire bonding apparatus configured to bond electrodes on a semiconductor chip and leads for wiring formed on a substrate with wires is known. The wire bonding apparatus is configured to bond balls formed at distal ends of the wires to electrodes of the semiconductor chip by pressing the wires against the leads together with an ultrasonic vibration to bond the electrodes on the semiconductor chip and the leads on the substrate. In the wire bonding apparatus, a bonding head is placed on and fixed to an XY table configured to be movable in a two-dimensional direction. A bonding arm that forms a bonding head has a configuration being rotatable about a supporting shaft. The bonding arm includes an ultrasonic horn to which a capillary as a bonding tool is mounted at one distal end thereof, and an ultrasonic transducer as an ultrasonic wave application device for applying the ultrasonic vibration on a capillary via the ultrasonic horn at the other distal end thereof.

However, the ultrasonic horn of the bonding arm of the related art needs a basic length of λ (sonic wave length)/2, and when mounting the bonding arm to the bonding head, a position of a node of λ/4 is fixed. Therefore, the length and the supporting method are limited. Therefore, in order to resolve these limitation, Patent Literature 1 discloses a wire bonding apparatus including a piezoelectric element configured to transmit vibrations to the capillary by electrostrictive or magnetostrictive effect assembled to the bonding arm in the vicinity of a position where the capillary of the bonding arm.

Patent Literature 2 discloses a low mass transducer in which a vibration generating mechanism is assembled to the capillary.

Patent Literature 3 discloses a wire bonding apparatus including a plurality of piezoelectric elements arranged adjacent to each other at a plurality of positions in the circumferential direction around the capillary, and configured to supply voltage having a predetermined phase shift to respective piezoelectric elements.

CITED REFERENCE

Patent Literature

PTL1: JP-A-5-275502
PTL2: U.S. Pat. No. 5,890,643
PTL3: JP-A-6-204302

SUMMARY OF INVENTION

Technical Problem

A wire bonding apparatus disclosed in Patent Literature 1 has a configuration in which piezoelectric element configured to transmit vibration to capillary is integrated in the vicinity of a position where the capillary of the bonding arm is to be mounted. The bonding arm in Patent Literature 1 is configured in such a manner that the vibration of the piezoelectric element is transmitted to the capillary via a frame-shaped vibration transmitting member. However, the mass of the vibration transmitting member as a load driven by the piezoelectric element is large and the vibration transmitting member itself has a natural frequency and driving at high frequencies such as 150 kHz is difficult. In addition, in order to drive a heavy load, an increase in size of the piezoelectric element is required.

The piezoelectric element is fixed to a frame-shaped hole provided on the bonding arm, and the piezoelectric element is pressurized via a frame. Therefore, there is a problem that spring property of the frame impairs expansion of the piezoelectric element, and the vibration is not efficiently transmitted.

In Patent Literature 2, a specific capillary for integrating a vibration generating mechanism using the piezoelectric element into a capillary is required, and hence provision of the vibration generating mechanism in the generally-used capillary is difficult. In addition, since the vibration generating mechanism is integrated in the capillary, which is a consumable good, the price becomes higher.

The piezoelectric element in all of Patent Literatures 1, 2, and 3, the piezoelectric element may be affected by heat from a heated work (hereinafter, a bonded component such as an IC chip is referred to as a work). In particular, in Patent Literatures 2 and 3, the piezoelectric element is integrated into an outer periphery of the capillary, the temperature of the vibration generating mechanism on the capillary is increased due to approach to the work at the time of bonding. In addition, in the case where the piezoelectric element is used at high frequencies, the temperature of the vibration generating mechanism is further increased, so that the piezoelectric element may be damaged by heat, or the performance of the piezoelectric element may be lowered.

Therefore, a reduction in weight and size of a load such as the vibration transmitting member driven by the piezoelectric element of the bonding arm and transmission of a stable vibration to the capillary are required. In addition, a reduction in influence of heat on the piezoelectric element from the work is required.

Accordingly, it is an object of the present invention to provide a bonding apparatus capable of reducing weight and size of a load driven by a piezoelectric element, transmitting a stable vibration to a capillary, allowing free selection of frequency and/or a magnitude of a vibration amplitude and, in addition, reducing an influence of heat from a work on the piezoelectric element.

Solution to Problem

In order to achieve the above-described object, a bonding apparatus of the present invention includes: a bonding arm extending in a direction intersecting a center axis of a bonding tool and including a receiving portion facing the center axis of the bonding tool; a pair of capillary holding portions arranged symmetrically with respect to the center axis of the bonding tool and coming into contact with the bonding tool; a pair of piezoelectric elements arranged symmetrically with respect to the center axis of the bonding tool and configured to generate an ultrasonic vibration in contact with the capillary holding portions; a generator configured to drive the piezoelectric elements; a pressurizing device including a pressurizing member arranged so as to face the receiving portion of the bonding arm with the center axis of the bonding tool interposed therebetween and a moving device configured to move the pressurizing member toward the receiving portion of the bonding arm, and is characterized in that the pressurizing member is moved in a state in which the pair of piezoelectric elements, the pair of capillary holding portions, and the bonding tool are placed between the receiving portion of the bonding arm and the pressurizing member to cause the bonding arm to hold the pair of capillary holding portions and the bonding tool.

The invention is characterized in that the capillary holding portions is formed of a material having a low thermal conductivity.

The invention is characterized in that the generator drives the pair of piezoelectric elements so as to have waveforms different in phase by 180° from each other.

The invention is characterized in that the capillary holding portions each include a surface having a curved shape on one side so as to come into contact with a surface less than half the outer periphery of the bonding tool, thereby holding the bonding tool, and a surface mounted in contact with vibrating surfaces (displacing surfaces) of the piezoelectric elements on the other side.

The invention is characterized in that the piezoelectric element is a laminated piezoelectric element formed by laminating ceramic piezoelectric elements.

The invention is characterized in that the generator is configured to variably set driving frequencies of the piezoelectric elements from one bonding point to another.

The invention is characterized in that the bonding arm further includes a plate-shaped frame having a hole for inserting the bonding tool, the pair of piezoelectric elements and the pair of capillary holding portions are arranged on an upper surface of the frame, and the bonding tool is inserted into the hole formed in the frame so that a distal end thereof is positioned on a lower surface side of the frame.

The invention is characterized in that wall surfaces facing each other and having a constant distance therebetween are provided on the upper surface of the frame, the pair of piezoelectric elements, the pair of capillary holding portions, and the bonding tool are arranged between one of the wall surfaces of the upper surface of the frame and the pressurizing member of the pressurizing device, and the pressurizing device is configured to change the magnitude of the pressure by varying the distance to one of the wall surfaces of the upper surface of the frame of the pressurizing member via the moving device.

According to the present invention, the reduction in weight of the load driven by the piezoelectric element is achieved. Therefore, responsiveness of the capillary is improved, switching of frequency at a first bonding point and a second bonding point is enabled depending on bonding conditions, and an optimal frequency is selected at each of the bonding point.

The responsiveness of the capillary is improved by the reduction in weight of the load driven by the piezoelectric element, and the magnitude of the vibration amplitude of the capillary being joined may be varied. For example, driving so as to increase the vibration amplitude of the capillary for removing an oxidized film on the surface thereof in the beginning and joining with a reduced vibration amplitude of the capillary are enabled.

By reducing the weight of the load driven by the piezoelectric element, the responsiveness of the capillary is improved, a time period in which a bad and a ball are in contact with each other is reduced, and the number of semiconductor components per unit time may be increased.

Also, since the pair of piezoelectric elements are arranged symmetrically with respect to the capillary, and the respective piezoelectric elements are driven so as to have waveforms different in phase from each other by 180°, the piezoelectric elements are displaced in such a manner that when one of the piezoelectric elements expands, the other piezoelectric element contracts. Therefore, a uniform force acts on the capillary via the capillary holding portions and hence the entire capillary can be vibrated (displaced) uniformly.

According to the present invention, since the vibrations from the piezoelectric element is transmitted to the capillary (hereinafter, a bonding tool is referred to as a capillary) via the capillary holding portions, an influence of heat on the piezoelectric elements by the capillary increased in temperature is alleviated.

Also, by forming the capillary holding portions of a material having a low thermal conductivity, the influence of heat is alleviated.

Since the piezoelectric elements are accommodated within a frame of the bonding arm, and hence the piezoelectric elements are prevented from being directly exposed to the heat from the work by the frame of the bonding arm, the influence of heat is alleviated.

Since resonance of a transducer is not used as in the related art, a frequency optimum for the capillary to be used can be selected and hence the piezoelectric elements may be driven at the selected frequency FIG. 1 is a drawing illustrating a configuration of a bonding arm, in which FIG. 1(a) is a side view of the bonding arm, and FIG. 1(b) is a bottom view of the bonding arm.

Figure 5A:
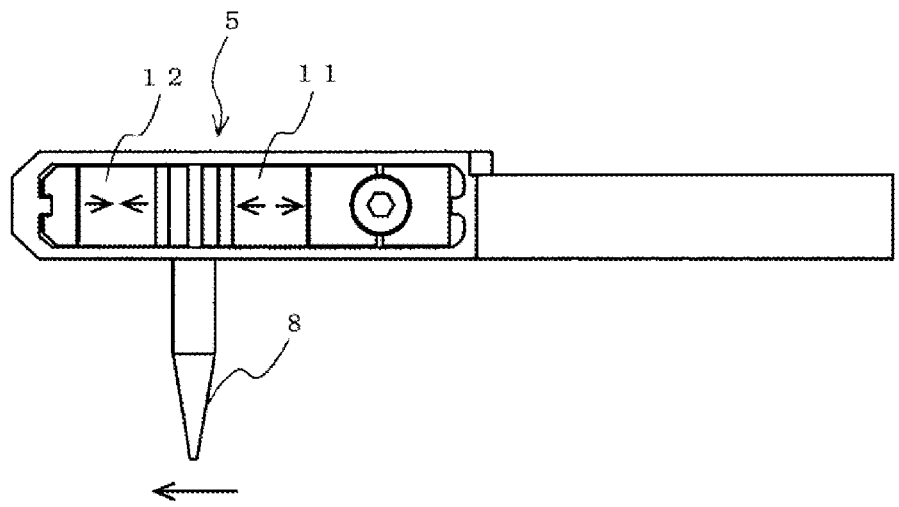
Figure 5B:
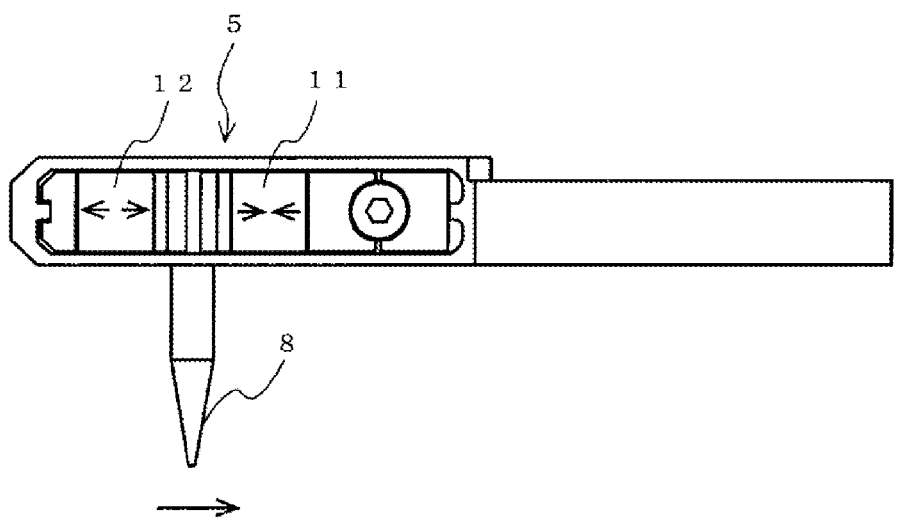

FIG. 5 is an explanatory drawing illustrating a vibration of a capillary of the bonding arm, in which FIG. 5(a) illustrates a vibrating (displacing) direction of the capillary when one of half cycles of one cycle of a voltage waveform is applied to the laminated piezoelectric element, and FIG. 5(b) is a drawing illustrating a vibrating (displacing) direction of the capillary when the other half cycle of the one cycle of the voltage waveform is applied to the laminated piezoelectric element.

Figure 6:
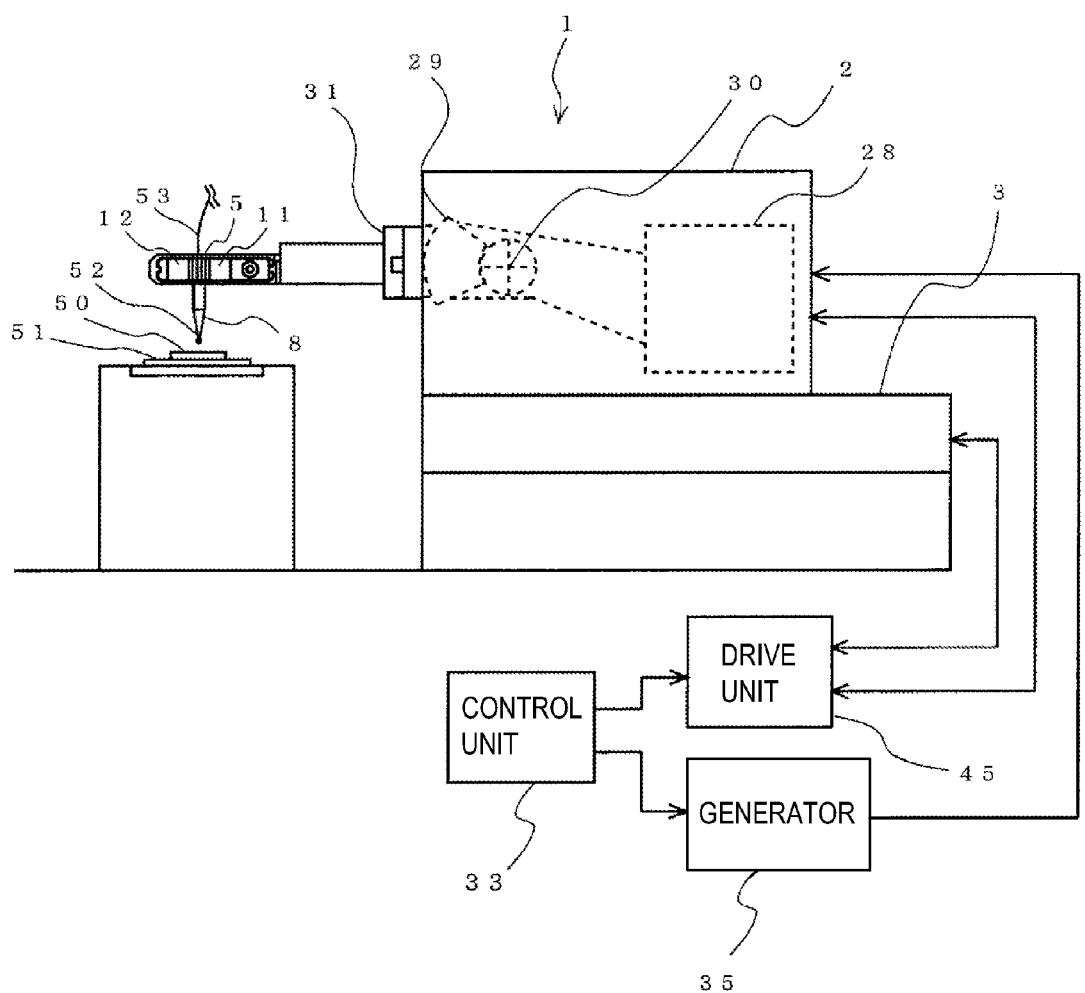

FIG. 6 is a block diagram illustrating a configuration of a bonding apparatus having the bonding arm mounted thereon.

DESCRIPTION OF EMBODIMENT

Referring now to the drawings, an embodiment for carrying out a bonding apparatus according to the present invention will be described. The bonding apparatus of the present invention includes a pair of capillary holding portions for holding a capillary as a bonding tool being integrated into a bonding arm having a substantially square shape in side view in the longitudinal direction of a bonding arm and a pair of piezoelectric elements configured to come into contact with the capillary holding portions and generate a ultrasonic vibration arranged symmetrically with respect to the capillary, so that a reduction in weight and size of the vibratory drive unit is achieved. In addition, a pressure is applied to the capillary holding portions and the piezoelectric elements by a pressure generating portion to transmit stable vibration to the capillary and, furthermore, to reduce an influence of heat from a work on the piezoelectric elements.

[Configuration of Bonding Arm]

Figure 1A:
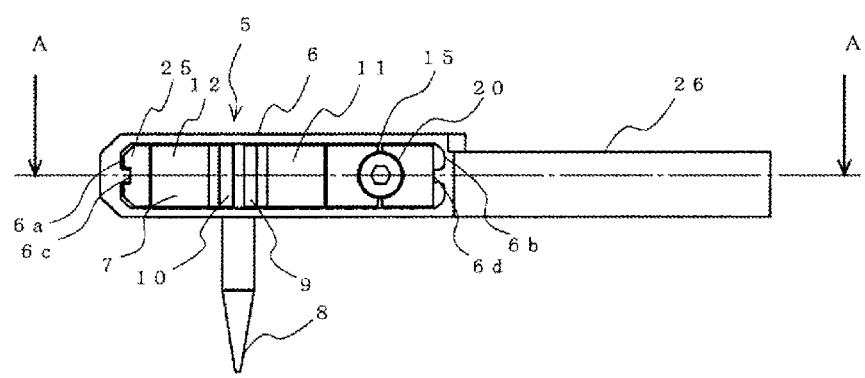
Figure 1B:
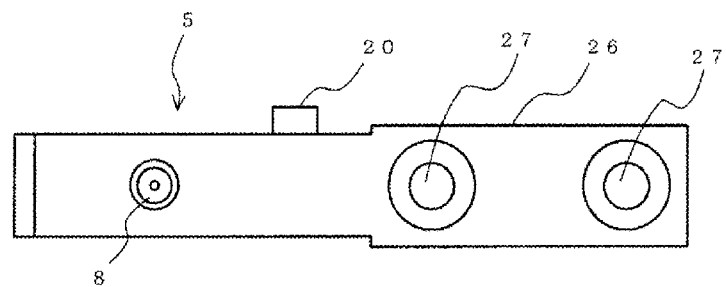
Figure 2:
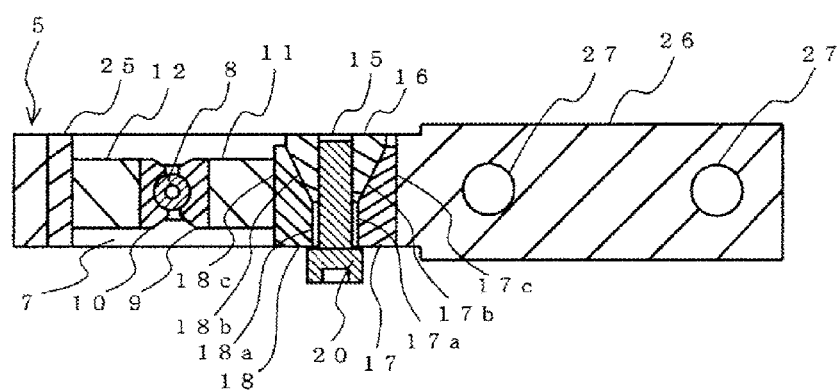
FIG. 2 is a cross-sectional view taken along the line A-A in FIG. 1(a), and is a plan view illustrating a configuration of the bonding arm.

Referring now to FIG. 1 and FIG. 2, the bonding arm of a bonding arm of a wire bonding apparatus as the bonding apparatus will be described. FIG. 1 is a drawing illustrating a configuration of the bonding arm, in which FIG. 1(a) is a side view of the bonding arm, FIG. 1(b) is a bottom view of the bonding arm, and FIG. 2 is a cross-sectional view taken along the line A-A in FIG. 1(a), and is a plan view illustrating a configuration of the bonding arm.

As illustrated in FIG. 1(a), a bonding arm 5 includes a capillary 8 as a bonding tool 8, a pair of capillary holding portions 9 and 10 configured to press an outer periphery of the capillary 8 and hold the capillary 8, piezoelectric elements as vibration drive sources (hereinafter, the piezoelectric elements are referred to as laminated piezoelectric elements 11 and 12), and a pressure generating portion 15 configured to apply a load from a certain distance to the capillary 8, the capillary holding portions 9 and 10, and the laminated piezoelectric elements 11 and 12 from a certain direction and presses the same as a pressurizing device.

As illustrated in FIG. 1(a) and FIG. 2, the bonding arm 5 has a substantially square shape in side view, and defines a frame 6. The frame 6 includes holes for mounting the capillary 8 on an upper surface and a lower surface. A side surface is provided with an internal space (hereinafter referred to also as an opening portion) 7 by the frame 6, and the capillary holding portions 9 and 10, and the laminated piezoelectric elements 11 and 12 are stored in the opening portion 7 of the bonding arm 5 symmetrically with respect to the capillary 8. Projecting portions 6c and 6d are provided at both end surfaces of the opening portion 7, and the projecting portions 6c and 6d are provided on the end surfaces 6a and 6b at center positions between the upper surface and the lower surface of the opening portion 7 in a projecting shape so as to extend in parallel to the upper surface and the lower surface. The end surface of the opening portion 7 provided with the projecting portion 6c is configured to receive the bonding tool 8, the capillary holding portions 9 and 10, and the laminated piezoelectric elements 11 and 12 via a guide fixture 25 to be pressed by the movement of the pressurizing member, and constitutes a receiving portion of the present invention. It is also possible to omit the projecting portion 6c, and support the guide fixture 25 by the entire surface of the end surface.

The receiving portion of the bonding arm 5 is provided at the projecting portion 6c of the end surface 6a of the opening portion. However, it is also possible to provide the same at an end of a plate-shaped frame, which is formed substantially into an L-shape. It is also possible to provide the receiving portion on one of both ends of the substantially U-shaped plate-shaped frame.

The capillary 8 as the bonding tool 8 includes a thin hole for allowing passage of a wire formed at an axial center thereof, is supported by the capillary holding portions 9 and 10, and is configured to join a ball formed at a distal end of the capillary 8 while applying a load to a pad or join the wire unwound from the distal end of the capillary 8 while applying a load to a surface of a lead. By applying an ultrasonic vibration to the capillary 8 during bond, bond is achieved at a lower hating temperature than the case where no ultrasonic vibration is applied to the capillary 8.

The capillary holding portions 9 and 10 is configured to hold the capillary 8 and transfer the vibrations of the laminated piezoelectric elements 11 and 12 to the capillary 8. As illustrated in FIG. 2, surfaces of the capillary holding portions 9 and 10 in contact with the capillary 8 are curved inward of the capillary holding portions 9 and 10 themselves, and are mounted so as to come into contact with surfaces of the outer periphery of the capillary 8, each of which is smaller than half the outer periphery of the capillary 8. As illustrated in FIG. 1(a) and FIG. 2, the capillary holding portions 9 and 10 are provided at positions symmetrically with respect to the capillary 8. Other surfaces of the capillary holding portions 9 and 10 are respectively in contact with vibrating surfaces of the laminated piezoelectric elements 11 and 12.

The capillary holding portions 9 and 10 are formed of a material having a lower thermal conductivity such as stainless, super alloy, or the like so as to be compact, and the mass is reduced in weight by more or less than 0.1 g. In this manner, the capillary holding portions 9 and 10 are provided along the outer periphery of the capillary 8.

As illustrated in FIG. 2, the pair of laminated piezoelectric elements 11 and 12 are provided in the bonding arm 5 so as to be positioned symmetrically with respect to the center axis of the capillary. The vibrating surfaces of the laminated piezoelectric elements 11 and 12 positioned on the capillary 8 side are in contact with the capillary holding portions 9 and 10, and the other vibrating surface of the laminated piezoelectric element 11 is in contact with a tapered portion 18 as a pressurizing member of the pressure generating portion 15. The other vibrating surface of the laminated piezoelectric element 12 is in contact with the surface of the guide fixture 25.

The laminated piezoelectric elements 11 and 12 are multi-layered elements each including a ceramic as a piezoelectric plate having a thickness on the order of 0.1 mm (millimeters), and an internal electrode formed on the surface of the piezoelectric plate laminated alternately. The laminated piezoelectric elements 11 and 12 configured in this manner each have an amount of displacement generated by application of a voltage being proportional to the amount of voltage to be applied to the number of the laminated piezoelectric plates and the magnitude of the voltage to be applied to the electrode. Therefore, the laminated piezoelectric element achieves a large amount of displacement in comparison with a single-plate-type piezoelectric element. Accordingly, the laminated piezoelectric element is suitable as the piezoelectric element as a transducer.

As described above, the pair of capillary holding portions 9 and 10 and the pair of laminated piezoelectric elements 11 and 12 are arranged on the bonding arm 5 lateral symmetrically with respect to the capillary 8 along the longitudinal direction of the bonding arm 5.

The guide fixture 25 illustrated in FIG. 1(a) is mounted on the bonding arm 5 between the projecting portion 6c on the end surface 6a of the opening portion 7 and the laminated piezoelectric element 12. The guide fixture 25 is provided with a guide groove on one of the surfaces thereof, and the other surface of the guide fixture 25 is configured to come into tight contact with the vibrating surface of the laminated piezoelectric element 12. Mounting of the guide fixture 25 to the bonding arm 5 is achieved, for example, by causing the guide groove of the guide fixture 25 to slide along the projecting portion 6c provided on the end surface 6a of the opening portion 7 of the bonding arm 5. By fitting between the projecting portion 6c on the end surface 6a of the opening portion 7 and the guide groove of the guide fixture 25 in the bonding arm 5, the guide fixture 25 and the laminated piezoelectric element 12 are capable of maintaining parallelism between the upper surface and the lower surface of the opening portion 7 without projecting the mounting state in the opening portion 7.

[Configuration of Pressure Generating Portion]

As illustrated in FIG. 2, the pressure generating portion 15 is configured to apply pressure to contact surfaces of the laminated piezoelectric element 11, the capillary holding portion 9, the capillary 8, the capillary holding portion 10, the laminated piezoelectric element 12, and the guide fixture 25 integrated in the bonding arm 5 and arranged in this sequence in the longitudinal direction from one direction. Accordingly, tight contact between the respective contact surfaces is enhanced.

As illustrated in FIG. 1(a) and FIG. 2, the pressure generating portion 15 is arranged at one end of the opening portion 7 of the bonding arm 5. The pressure generating portion 15 includes a movable portion 16 having a trapezoidal column shape, tapers 17, 18 positioned on the left and right of the movable portion 16, and a bolt 20 integrated in the movable portion 16. The movable portion 16 of the pressure generating portion 15 is provided with a screw hole formed so as to penetrate therethrough. One end of a metallic round rod of the bolt 20 is provided with a thread, and the threaded round rod of the bolt 20 is screwed into the screw hole of the movable portion 16. An outer periphery of the movable portion 16 has an inclined surface, and the inclined surface is in tight contact with parts of the tapered portions 17 and 18.

The tapered portion 18 of the pressure generating portion 15 constitutes a pressurizing member, and the movable portion 16 of the pressure generating portion 15 and the bolt 20 constitute a moving device that moves the tapered portion 18 as the pressurizing member toward the receiving portion 6a of the bonding arm.

The tapered portions 17 and 18 located on the left and right of the movable portion 16 are formed into a substantially trapezoidal shape in FIG. 2. One end of the tapered portion 18 located on the capillary 8 side and constituting a pressurizing surface 18c is in contact with the vibrating surface of the laminated piezoelectric element 11, and the other end of the tapered portion 18 includes a curved flat surface 18a and a inclined surface 18b, and the inclined surface 18b of the tapered portion 18 is in tight contact with the inclined surface of the movable portion 16 as illustrated in FIG. 2. In contrast, one end of the tapered portion 17 forming a pressurizing surface 17c of the tapered portion 17 located on the end surface 6b side of the opening portion 7 in the bonding arm 5 is in contact with a projecting portion 6d (illustrated in FIG. 1(a)) of the opening portion 7 of the bonding arm 5, and the other end of the tapered portion 17 includes a curved flat surface 17a and an inclined surface 17b, and the inclined surface 17b of the tapered portion 17 is in tight contact with an inclined surface of the movable portion 16 as illustrated in FIG. 2.

The bolt 20 is inserted into a space surrounded by curved surfaces provided on the curved flat surfaces 17a and 18a of the tapered portions 17 and 18. The bolt 20 is inserted into a screw hole provided at a center of the movable portion 16 penetrating through the curved spaces of the tapered portions 17 and 18.

As illustrated in FIG. 2, the movable portion 16 moves toward a head portion of the bolt 20 by rotating the bolt 20 in the direction of rotation of the clock. By the movement of the movable portion 16 toward the head portion of the bolt 20, the tapered portions 17 and 18 as the pressurizing member move so as to open leftward and rightward by the tapered surfaces thereof, whereby a pressurizing force is applied to the projecting portion 6d of the wall surface and the laminated piezoelectric element 11 in the bonding arm 5.

When assembling the laminated piezoelectric elements 11 and 12, and the capillary holding portions 9 and 10 in the opening portion 7 of the bonding arm 5, the capillary holding portion 9 is fixedly adhered to one of the vibrating surfaces of the laminated piezoelectric element 11, and the capillary holding portion 10 is adhered to one of the vibrating surfaces of the laminated piezoelectric element 12 to fixedly adhere the guide fixture 25 to the other vibrating surface of the laminated piezoelectric element 12. Subsequently, pressurization or the like is adjusted by the pressure generating portion 15 in order to position the laminated piezoelectric elements 11 and 12 and the capillary holding portions 9 and 10 so as to have a gap with respect to the inner walls of the upper plate and a lower plate of the opening portion 7 of the bonding arm 5. Accordingly, an influence of the contact with the inner walls of the upper plate and the lower plate on the vibration is eliminated.

In this manner, the pressure generating portion 15 is configured to vary the magnitude of pressurization by varying the distance to the wall surfaces at both ends of the opening portion (internal space) 7 of the bonding arm 5 that are defined by pressurizing surfaces 17c and 18c so as to cause the pressure to be applied to the contact surfaces of the laminated piezoelectric elements 11 and 12 and the capillary holding portions 9 and 10, so as to function as a wedge.

Although the pressure generating portion 15 is positioned between the capillary 8 and the projecting portion 6d of the bonding arm 5, the pressure generating portion 15 may be positioned at an opposite position with the capillary 8 interposed therebetween, that is, a position between the capillary 8 and the projecting portion 6c.

The pressure generating portion 15 as the pressurizing device is not limited to the above-described configuration, and may be of any type as long as being fixed by an application of the pressure by the moving device. For example, any one of fixation by a cylinder, tightening by a ball screw, and pressurization by a clamp is applicable.

As illustrated in FIG. 1(b), a bottom portion (lower surface) of the bonding arm 5, that is, a surface facing the work at the time of bonding has a flat surface by the frame 6 and blocks heat from the work. Therefore, heat is not directly applied to the laminated piezoelectric elements 11 and 12 integrated in the bonding arm 5. Therefore, the influence of heat on the laminated piezoelectric elements 11 and 12 may be alleviated by the bonding arm 5.

The laminated piezoelectric element applies a vibration to the capillary via the capillary holding portions 9 and 10 formed to have a light weight and a compact size. Therefore, the responsiveness of the capillary is improved, and selection of an optimum frequency at each bonding point is enabled.

[Drive Circuit of Laminated Piezoelectric Element]

Figure 3:
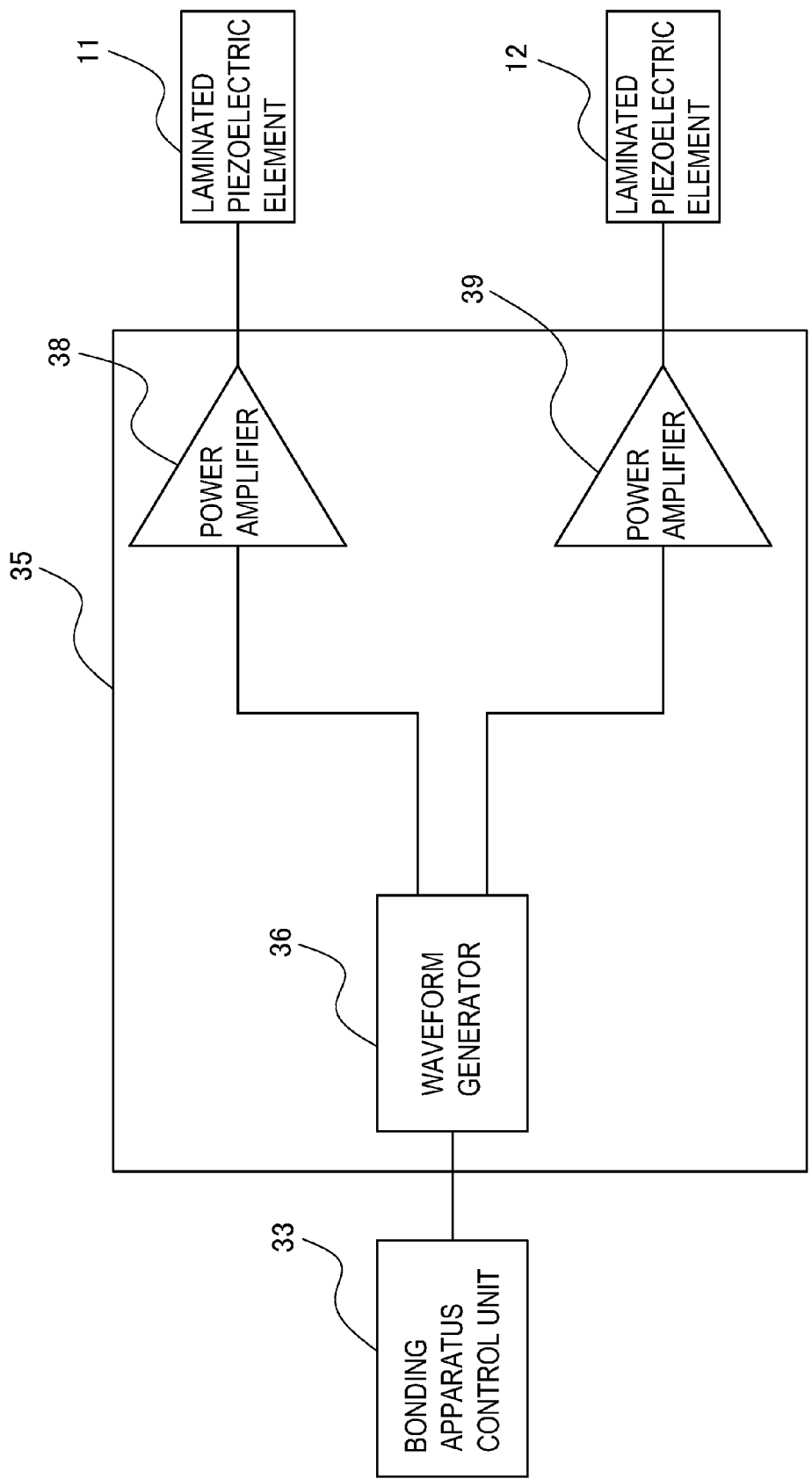
FIG. 3 is a block diagram illustrating a configuration of a generator that drives a laminated piezoelectric element.

Subsequently, a generator configured to drive the laminated piezoelectric elements 11 and 12 integrated in the bonding arm 5 will be described with reference to FIG. 3 and FIG. 4. FIG. 3 is a block diagram illustrating a configuration of the generator that drives the laminated piezoelectric element, and FIG. 4 is a drawing illustrating a voltage waveform applied to the laminated piezoelectric element.

As illustrated in FIG. 3, a generator 35 configured to drive the laminated piezoelectric elements 11 and 12 includes a waveform generator 36 and power amplifiers 38 and 39. The laminated piezoelectric elements 11 and 12 illustrated in FIG. 3 employs a single voltage-type piezoelectric element. The waveform generator 36 outputs sinusoidal wave signals having a predetermined frequency to the power amplifiers 38 and 39 on the basis of the signal from a control unit 33 of the bonding apparatus 1. The control unit 33 of the bonding apparatus 1 outputs data on amplitudes, frequencies, and bias values of the sinusoidal wave for generating a voltage waveform that drives the laminated piezoelectric elements 11 and 12 to the waveform generator 36. The waveform generator 36 sets driving conditions such as amplitudes, frequencies, and bias values of the sinusoidal wave of the generator (which is not illustrated) integrated on the basis of the data from the control unit 33 of the bonding apparatus 1. The waveform generator 36 outputs a signal to the power amplifiers 38 and 39 by an activating signal from the control unit 33 of the bonding apparatus 1. The signals output from the waveform generator 36 to the power amplifiers 38 and 39 are different in face by 180°. The power amplifiers 38 and 39 amplitude the power of the signal from the waveform generator 36, the power amplifier 38 outputs the same to the laminated piezoelectric element 11, and the power amplifier 39 outputs the same to the laminated piezoelectric element 12. The power amplifiers 38 and 39 are provided with a voltage and a current capacity required for constant voltage driving of the laminated piezoelectric elements 11 and 12 on the basis of a command voltage from the waveform generator 36.

[Drive Waveform of Laminated Piezoelectric Element]

Figure 4:
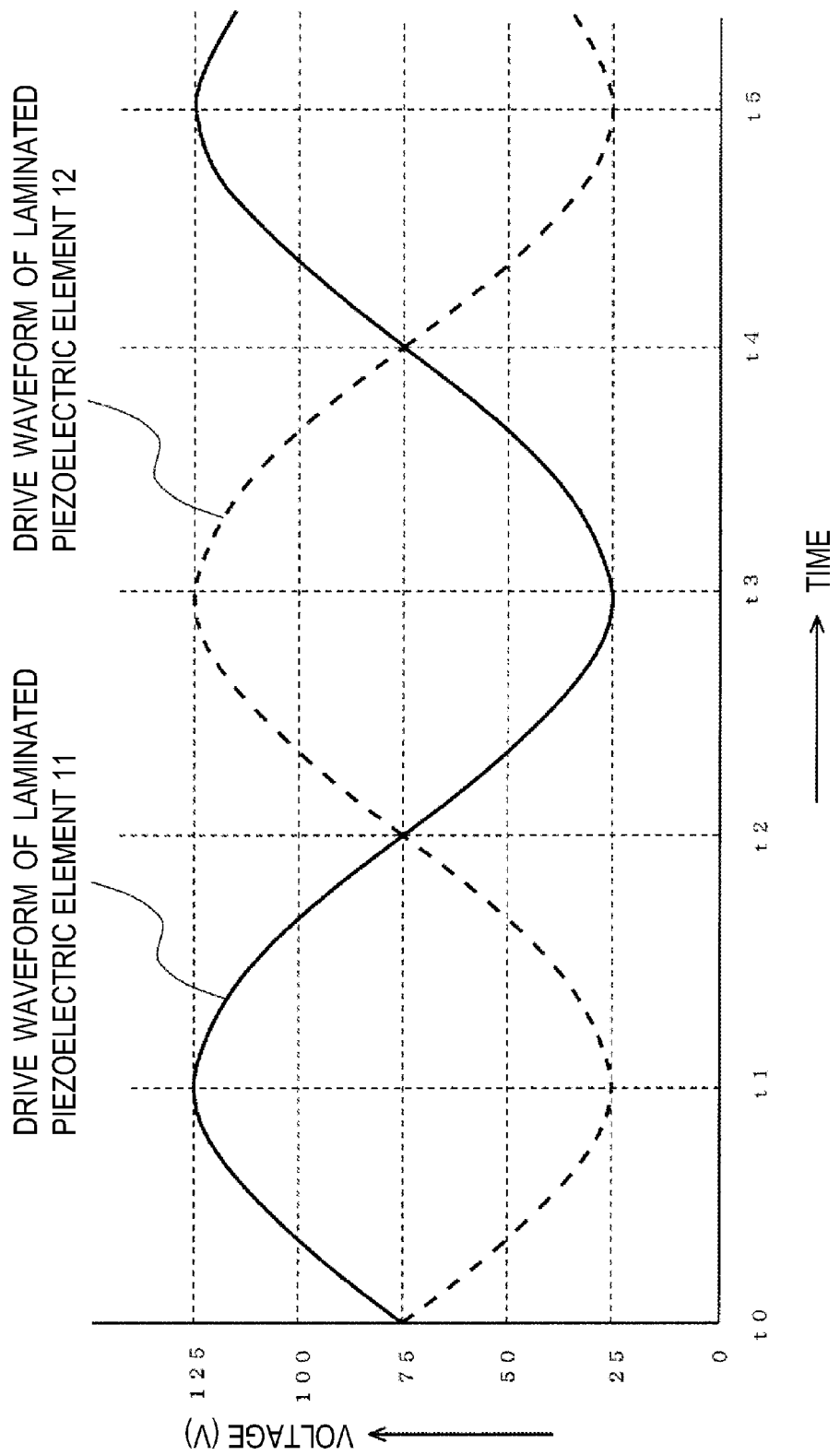
FIG. 4 is a drawing illustrating a voltage waveform applied to the laminated piezoelectric element.

FIG. 4 illustrates an example of waveforms of supply voltages output from the power amplifiers 38 and 39. As illustrated in FIG. 4, the waveforms of the supply voltages output form the power amplifiers 38 and 39 are sinusoidal voltage waveforms. This is to prevent destruction of the laminated piezoelectric elements 11 and 12 or occurrence of resonance caused by an abrupt change of the supply voltage. In FIG. 4, the drive waveform of the laminated piezoelectric element 11 and the drive waveform of the laminated piezoelectric element 12 are shown by a solid line and a dot line, respectively.

As illustrated in FIG. 4, the drive waveforms of the laminated piezoelectric elements 11 and 12 have the same frequency and have a phase difference of 180°. In the case where the laminated piezoelectric elements 11 and 12 are single voltage-type piezoelectric elements, a positive bias voltage is applied so as to prevent the driving voltage from becoming a negative voltage. In the example illustrated in FIG. 4, the amplitude of the voltage waveform is 100V, the bias voltage is 75V, the maximum voltage is 125V, and the minimum voltage is 25V. A period from t0 to t4 in FIG. 4 corresponds to one cycle, and the frequency at this time is $1/(t4-t0)$.

As illustrated in FIG. 4, the laminated piezoelectric elements 11 and 12 are applied with the bias voltage of 75V at t0 respectively, and the laminated piezoelectric element 11 is applied with the maximum voltage of 125V, and the laminated piezoelectric element 12 is applied with the minimum voltage of 25V respectively at t1. The laminated piezoelectric elements 11 and 12 are returned to a state of being applied with a bias voltage of 75V at t2, that is, at a half cycle, respectively, and the laminated piezoelectric element 11 is applied with the minimum voltage of 25V, and the laminated piezoelectric element 12 is applied with the maximum voltage 125V at t3. Subsequently, the laminated piezoelectric elements 11 and 12 are brought into a state in which the bias voltage of 75V is applied, respectively at t4. In this manner, the laminated piezoelectric elements 11 and 12 are driven at a waveform having a phase difference of 180° at the same frequency. The laminated piezoelectric elements 11 and 12 are set to be a start-driving voltage, which is a bias voltage, in advance before driving.

[Vibration of Capillary]

Subsequently, the vibration of the capillary of the bonding arm will be described with reference to FIG. 5. FIG. 5 is an explanatory drawing illustrating the vibration of the capillary of the bonding arm, in which (a) illustrates a vibrating (displacing) direction of the capillary when one of half cycles out of one cycle of the voltage waveform is applied to the laminated piezoelectric element, and (b) illustrates a vibrating (displacing) direction when the other half cycle out of the one cycle of the voltage waveform is applied to the laminated piezoelectric element.

A high-frequency voltage having a waveform of the sinusoidal wave from the generator 35 is applied to the laminated piezoelectric element 11. A high-frequency voltage having a waveform of the sinusoidal wave shifted in phase by 180° from the phase of the high-frequency voltage of the sinusoidal wave applied to the laminated piezoelectric element 11 is applied from the generator 35 to the laminated piezoelectric element 12. When the high-frequency voltage of the half cycle from t3 to t5 illustrated in FIG. 4 is applied, the vibrating surfaces of the laminated piezoelectric element 12 acts to be contracted, for example, as illustrated by an arrow when the vibrating surfaces of the laminated piezoelectric element 11 acts to be expanded as illustrated by an arrow as illustrated in FIG. 5(a). The vibrating surfaces of the laminated piezoelectric elements 11 and 12 are displaced in the same direction as the longitudinal direction of the bonding arm 5. At this time, the capillary 8 is displaced in the direction indicated by an arrow in FIG. 5(a).

In contrast, when the high-frequency voltage of a half cycle from t1 to t3 illustrated in FIG. 4 is applied, as illustrated in FIG. 5(b), the vibrating surfaces of the laminated piezoelectric element 12 acts to be expanded as illustrated by an arrow for example when the vibrating surfaces of the laminated piezoelectric element 11 acts so as to be contracted as illustrated by an arrow. At this time, the capillary 8 is displaced in the direction indicated by an arrow in FIG. 5(b).

Accordingly, the direction of displacement of the capillary 8 changes at every half cycle of the drive waveform, and by applying the high-frequency voltage continuously to the laminated piezoelectric elements 11 and 12, a vibration occurs in the capillary 8. The number of vibrations of the capillary 8 is determined depending on the frequency of the high-frequency voltage that drives the laminated piezoelectric elements 11 and 12. The laminated piezoelectric elements 11 and 12 are induced to vibrate by the high-frequency voltage from the generator 35, and the vibration is propagated to the capillary 8 via the capillary holding portions 9 and 10. The allowable range of the frequency of the high-frequency voltage to be applied to the laminated piezoelectric elements 11 and 12 is up to a frequency on the order of 150 KHz, so that the capillary 8 can be driven to the number of vibrations on the order of 150 KHz.

In this manner, the pair of piezoelectric elements are arranged symmetrically with respect to the capillary, and the respective piezoelectric elements are driven at the drive waveforms different in phase from each other by 180°. Therefore, when one of the piezoelectric elements is expanded, the other piezoelectric element is displaced so as to be contracted. Accordingly, a uniform force acts on the capillary via the capillary holding portions without having the spring like characteristics, so that the entire capillary can be vibrated (displaced) uniformly.

[Bonding Apparatus]

Subsequently, the bonding apparatus having the bonding arm mounted thereon will be described with reference to FIG. 6. FIG. 6 is a block diagram illustrating a configuration of the bonding apparatus having the bonding arm mounted thereon. As illustrated in FIG. 6, the bonding arm 5 of the wire bonding apparatus 1 as the bonding apparatus 1 is mounted to a drive arm of the bonding head 2 via a connecting fixture 31. The drive arm of the bonding head 2 is provided with a linear motor 28 configured to cause the bonding arm 5 to pivot in the vertical direction and an encoder 29 configured to detect the position of the capillary 8 in the bonding arm 5. The linear motor 28 is controlled by the drive unit 45, and the bonding arm 5 pivots in the vertical direction via a supporting shaft 30 by the vertical movement of the movable portion of the linear motor 28. The bonding head 2 is mounted on a XY table 3, so that the capillary 8 of the bonding arm 5 can be positioned right above the bonding point on the work by controlling the XY table 3 by the drive unit 45.

The wire bonding apparatus 1 as the bonding apparatus 1 illustrated in FIG. 6 includes a wire clamp mechanism (which is not illustrated) configured to grip a wire 53, a torch rod (which is not illustrated) for forming a ball 52 at a distal end of the capillary, and a wire supply mechanism (which is not illustrated) for supplying the wire 53 in the bonding head 2.

A bonding action controls the capillary 8 to be positioned right above the bonding point by the XY table 3. The bonding head 2 moves the bonding arm downward by the linear motor 28 and detects whether the distal end of the capillary 8 touches the bonding point by the encoder. Normally, a first bonding point is a pad of a semiconductor element 50, and a second bonding point is a lead of a lead frame 51. The ball 52 to be joined to the first bonding point or the wire 53 to be joined to the second bonding point is fed from the distal end of the capillary. After the fact that the distal end of the capillary 8 touches the bonding point from the signal of the encoder 29 has confirmed, a bonding load is applied to the capillary 8 of the bonding arm 5 and the driving voltage is supplied to the laminated piezoelectric elements 11 and 12 from the generator 35 to vibrate the capillary 8, so that the bonding is performed. The laminated piezoelectric elements 11 and 12 vibrate at a frequency of the driving voltage from the generator 35 and perform ultrasonic vibration at a vibration amplitude depending on the magnitude of the driving voltage. The vibrations of the laminated piezoelectric elements 11 and 12 are propagated to the capillary 8 via the capillary holding portions 9 and 10. After the bonding load and the ultrasonic vibration have applied to the capillary 8 for a predetermined time, the bonding at the bonding point is completed.

As described thus far, since the bonding apparatus of the present invention achieves the reduction of weight of the load driven by the piezoelectric element, improves the responsiveness of the capillary, enables switching of the frequency at the first bonding point and the second bonding point, and enables selection of the optimum frequencies at the respective bonding points.

The responsiveness of the capillary is improved by the reduction in weight of the load driven by the laminated piezoelectric element, so that the magnitude of the vibration amplitude of the capillary being bonded may be varied. For example, bonding may be achieved by driving the capillary to have a large vibration amplitude at the beginning in order to remove an oxidized film on the surface, and then driving the capillary to have a small vibration amplitude.

In addition, the responsiveness of the capillary is improved by the reduction in weight of the load driven by the laminated piezoelectric element, the bonding time for the pad and the ball is reduced, so that the number of semiconductor components to be produced per unit time may be increased.

Since the bonding apparatus of the present invention is configured to transmit the vibration from the piezoelectric element to the capillary (bonding tool) via the capillary holding portions, the influence of heat from the capillary increased in temperature on the piezoelectric element is alleviated.

Also, by forming the capillary holding portions of a material having a low thermal conductivity, the influence of heat is alleviated.

Since the laminated piezoelectric elements are accommodated within a frame of the bonding arm, and hence the piezoelectric elements are prevented from being directly exposed to the heat from the work by the frame of the bonding arm, the influence of heat is alleviated.

Although a configuration in which the embodiment of the bonding arm having the pair of laminated piezoelectric elements in which the pair of laminated piezoelectric elements is driven simultaneously has been described, only one of the laminated piezoelectric element from between the pair of laminated piezoelectric elements may be driven.

Also, a configuration of the bonding arm including the pair of laminated piezoelectric elements in which one of the laminated piezoelectric elements is used as a vibration actuator and the other piezoelectric element is used as a vibration sensor to detect the state of vibration of the capillary is also applicable.

The bonding apparatus of the present invention is not limited to the wire bonding apparatus, and may be applied to other bonding apparatuses, for example, the bump bonder or the like.

The present invention may be embodied in a number of types without departing from the essential characteristic thereof. Therefore, the embodiment described above is only for description, and is not intended to limit the present invention.

REFERENCE SIGNS LIST

1 bonding apparatus (wire bonding apparatus)
2 bonding head
3 XY table
5 bonding arm
6 frame
6a, 6b end surface
6c projecting portion (receiving portion)
6d projecting portion
7 internal space (opening portion)
8 bonding tool (capillary)
9, 10 capillary holding portions
11, 12 laminated piezoelectric element (piezoelectric element)
15 pressure generating portion
16 movable portion
17 tapered portion
18 tapered portion (pressurizing member)
17a, 18a curved flat surface
17b, 18b inclined surface
17c, 19c pressurizing surface
20 bolt
25 guide fixture
26 mounting portion
27 mounting hole
28 linear motor
29 encoder
30 supporting shaft
31 connecting fixture
33 control unit
35 generator
36 waveform generator
38, 39 power amplifier
45 drive unit
50 semiconductor element
51 lead frame
52 ball
53 wire

The invention claimed is:

1. A bonding apparatus comprising:
   a bonding arm having a receiving portion extending in a direction intersecting a center axis of a bonding tool and facing the center axis of the bonding tool;
   a pair of laminated piezoelectric elements arranged symmetrically with respect to the center axis of the bonding tool and configured to generate an ultrasonic vibration;
   a generator configured to drive the laminated piezoelectric elements;

a pair of capillary holding portions configured to hold the bonding tool with surfaces which come into contact with the bonding tool being curved inward and to transfer the vibration of the laminated piezoelectric elements to the bonding tool with other surfaces in contact with vibration surfaces of the laminated piezoelectric elements; and a pressurizing device including a movable portion having a trapezoidal column shape, a pair of tapered portions located on respective opposite sides of the movable portion, and a bolt integrated into the movable portion, the movable portion being in tight contact with the pair of tapered portions at an inclined surface of an outer periphery of each of the pair of tapered portions, wherein the bonding arm is configured to hold the capillary holding portions and the bonding tool by moving one of the pair of tapered portions of the pressurizing device in a state in which the laminated piezoelectric elements, the capillary holding portions, and the bonding tool are positioned between the receiving portion of the bonding arm and the one of the pair of tapered portions.

2. The bonding apparatus according to claim 1, wherein the generator drives the pair of laminated piezoelectric elements so as to have waveforms different in phase by 180° from each other.

3. The bonding apparatus according to claim 1, wherein the pair of laminated piezoelectric elements are piezoelectric elements formed by laminating ceramic piezoelectric elements.

4. The bonding apparatus according to claim 1, wherein the generator is configured to variably set driving frequencies of the laminated piezoelectric elements from one bonding point to another.

* * * * *